US010615480B2

(12) United States Patent
Strong et al.

(10) Patent No.: US 10,615,480 B2
(45) Date of Patent: *Apr. 7, 2020

(54) RADIO FREQUENCY CONNECTION ARRANGEMENT

(71) Applicant: Cambium Networks Limited, Ashburton, Devon (GB)

(72) Inventors: Peter Strong, Ipplepen (GB); Adam Wilkins, Plymouth (GB); Carl Morrell, Kingsteignton (GB); Paul Clark, Paignton (GB); Nigel Jonathan Richard King, Rattery (GB)

(73) Assignee: CAMBIUM NETWORKS LIMITED, Ashburton, Devon (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,798

(22) Filed: Feb. 15, 2019

(65) Prior Publication Data

US 2019/0181529 A1  Jun. 13, 2019

Related U.S. Application Data

(63) Continuation of application No. 15/828,886, filed on Dec. 1, 2017, now Pat. No. 10,211,504, which is a (Continued)

(30) Foreign Application Priority Data

Feb. 13, 2015 (GB) .................................. 1502461.5

(51) Int. Cl.
*H01P 5/02* (2006.01)
*H05K 1/02* (2006.01)
*H01P 3/08* (2006.01)

(52) U.S. Cl.
CPC .............. *H01P 5/028* (2013.01); *H01P 3/081* (2013.01); *H05K 1/025* (2013.01); *H05K 1/0239* (2013.01); *H05K 1/0225* (2013.01)

(58) Field of Classification Search
CPC .. H01P 3/08; H01P 3/081; H01P 3/082; H01P 5/028; H01P 5/082; H01P 5/085; H05K 1/025; H05K 1/0225; H05K 1/0239
(Continued)

(56) References Cited

U.S. PATENT DOCUMENTS 5,765,835 A     6/1998  Johnson
9,837,697 B2 * 12/2017  Strong .................... H01P 5/028
(Continued)

FOREIGN PATENT DOCUMENTS

EP     1 928 053 A1    6/2008
GB       828241       2/1960
(Continued)

OTHER PUBLICATIONS

Ho, Fan and Chang; "Slot-coupled double-sided microstrip interconnects and couplers," IEEE MTT-S International Microwave Symposium Digest, 1993, pp. 1321-1324.
(Continued)

*Primary Examiner* — Rakesh B Patel
*Assistant Examiner* — Jorge L Salazar, Jr.
(74) *Attorney, Agent, or Firm* — Brinks Gilson & Lione (57) ABSTRACT

A radio frequency transmission arrangement comprises a ground plate having an aperture comprising a slot with an elongate cross-section and substantially parallel sides, and a first and second transmission line. The thickness of the ground plate is greater than a width of the slot. The first transmission line comprises a first elongate conductor on a first side of the ground plate and has an end terminated with a first termination stub. The second transmission line com-
(Continued)

prises a second elongate conductor on the opposite side of the ground plate and has an end terminated with a second termination stub. The first transmission line is arranged to cross the slot at a point adjacent to the first termination stub, and the second transmission line is arranged to cross the slot at a point adjacent to the second termination stub.

15 Claims, 5 Drawing Sheets

Related U.S. Application Data continuation of application No. 14/839,296, filed on Aug. 28, 2015, now Pat. No. 9,837,697.

(58) Field of Classification Search
USPC ........................................ 333/24 R, 238, 246
See application file for complete search history.

(56) References Cited

U.S. PATENT DOCUMENTS

| 10,211,504 | B2 * | 2/2019 | Strong .................... H01P 5/028 |
| 2007/0126524 | A1 | 6/2007 | Yagisawa |
| 2010/0182096 | A1 | 7/2010 | Kim et al. |
| 2013/0057365 | A1 * | 3/2013 | Mizushima ............. H01P 1/047 |
| | | | 333/238 |
| 2013/0162366 | A1 | 6/2013 | Essenwanger |
| 2014/0240191 | A1 | 8/2014 | Lee et al. |

FOREIGN PATENT DOCUMENTS

| JP | H0697724 A | 4/1994 |
| JP | 2000059138 A | 2/2000 |
| JP | 2004187281 A | 7/2004 |
| WO | WO 2008/109662 A1 | 9/2008 |

OTHER PUBLICATIONS

Chen, C. et al., "Optimization of Aperture Transitions for Multiport Microstrip Circuits," IEEE Transactions on Microwave Theory and Techniques, Dec. 1996, vol. 44, No. 12, pp. 2457-2465.
Bialkowski, M.E. et al., "Reflectarrays: Potentials and Challenges," International Conference on Electromagnetics in Advanced Applications, 2007, ICEAA2007, Sep. 17-21, 2007, pp. 1050-1053.
UKIPO Search Report from Corresponding Great Britain Application No. GB1502461.5 dated May 18, 2015, 4 pages.
Partial International Search Report corresponding to PCT/GB2016/050346 dated Jun. 28, 2016, 5 pages.
International Search Report and Written Opinion corresponding to PCT/GB2016/050346 dated Oct. 13, 2016, Oct. 13, 2016, 11 pages.
UKIPO Examination Report from Corresponding Great Britain Application No. GB1502461.5 dated Feb. 10, 2017, 3 pages.

* cited by examiner

-- Prior Art --

FIG. 3

-- Prior Art --

FIG. 7 i # RADIO FREQUENCY CONNECTION ARRANGEMENT

RELATED APPLICATIONS

This application is a continuation of U.S. application Ser. No. 15/828,886, filed on Dec. 1, 2017, entitled "RADIO FREQUENCY CONNECTION ARRANGEMENT," issuing as U.S. Pat. No. 10,211,504 on Feb. 19, 2019, which is a continuation of U.S. application Ser. No. 14/839,296, filed on Aug. 28, 2015, entitled "RADIO FREQUENCY CONNECTION ARRANGEMENT," issued as U.S. Pat. No. 9,837,697 on Dec. 5, 2017, which claims the benefit of priority to Great Britain Application No. GB 1502461.5, filed on Feb. 13, 2015, entitled "RADIO FREQUENCY CONNECTION ARRANGEMENT," the contents of all of which are incorporated herein by reference in their entirety.

TECHNICAL FIELD

The present invention relates generally to a radio frequency circuit implementation for connecting a transmission line to another a transmission line, and more specifically, but not exclusively, to a radio frequency transmission arrangement for connecting a radio frequency signal from a transmission line on one side of a ground plate to a transmission line on the other side of the ground plate.

BACKGROUND

In modern wireless systems, such as for example cellular wireless and fixed radio access wireless networks, there is a need for equipment operating with radio frequency signals, such as radio transceiver equipment in user equipment or at base stations or access points, which is economical to produce, while having high performance at radio frequencies. Increasingly high radio frequencies are being used as spectrum becomes scarce and demand for bandwidth increases. Furthermore, antenna systems are becoming increasingly sophisticated, often employing arrays of antenna elements to provide controlled beam shapes and/or MIMO (multiple input multiple output) transmission. Typically, radio frequency circuits are constructed with unbalanced transmission lines for transmission of radio frequency signals between components of the circuit, such as between amplifiers, filters, detectors, antennas and many other types of radio frequency component. An unbalanced transmission line comprises a signal conductor, such as a printed track of a circuit board, and a ground structure, such as a ground plane of a circuit board or a conductive ground plate, such as a milled aluminium plate. If one transmission line is connected to another transmission line, the signal conductor of one transmission line needs to be connected, at least at radio frequency, to the signal conductor of the other transmission line. It is also important that there is a good radio frequency connection between the ground structures of the respective transmission lines. This ensures a low loss connection between the transmission lines and, by ensuring that the conductors are referenced to the same ground voltage, reduces pick up of spurious signals.

Electronic equipment may be constructed with a ground plate having radio frequency electronic circuitry on both sides of it. For example, a ground plate may be a backing plate for an antenna array, and a radio transceiver may be mounted on the other side of the backing plate from the antenna array. There is typically a need to connect signals from one side of the ground plate to the other, for example between the antenna array and the transceiver.

Conventionally, signals may be connected through a ground plate using co-axial radio frequency connectors. Such co-axial connectors are typically made to tight mechanical tolerances and are relatively expensive, often being gold pated for example to ensure a good electrical connection and avoid corrosion. A poorly made or corroded connector may result in a poor radio frequency connection, resulting in signal loss or may even produce a connection with non-linear transmission characteristics resulting in generation of spurious signal components. There is a need for a low cost, high performance radio frequency connection, preferably tolerant of mechanical misalignment, between a transmission line on one side of a ground plate and a transmission line on the other side of the ground plate.

It is known to couple radio frequency signals between transmission lines on different layers of a printed circuit board using slot-coupled interconnects. The publication "Slot-Coupled Double-Sided Microstrip Interconnects and Couplers" by Ho, Fan and Chang, 1993 IEEE MTT-S Digest, discloses slot-coupled interconnects for coupling radio frequency signals between layers of a multi-layer printed circuit board, through an aperture in a ground plane forming a layer of the printed circuit board.

It is an object of the invention to mitigate the problems of the prior art.

SUMMARY

In accordance with a first aspect of the present invention, there is provided a radio frequency connection arrangement comprising:

a ground plate having first and second opposite sides and an aperture passing through the ground plate from the first side to the second side, the aperture comprising a slot, the slot having an elongate cross-section in the plane of the first side of the ground plate, the cross-section having substantially parallel sides extending along the length of the cross section, and the slot having a width which is the distance between the parallel sides of the cross-section of the slot;

a first transmission line comprising a first elongate conductor disposed on the first side of the ground plate in a substantially parallel relationship with the first side of the ground plate, the first transmission line having an end terminated with a first termination stub; and a second transmission line comprising a second elongate conductor disposed on the second side of the ground plate in a substantially parallel relationship with the second side of the ground plate, the second transmission line having an end terminated with a second termination stub, wherein the first transmission line is arranged to cross the slot at a point adjacent to the first termination stub, and the second transmission line is arranged to cross the slot at a point adjacent to the second termination stub, and wherein the thickness of the ground plate is greater than a width of the slot.

This allows signals to be coupled from the first transmission line on one side of a ground plate to the second transmission line on the other side, and vice versa, without an electrically conductive connection between the conductors of the first and second transmission lines. This provides a connection which causes low loss to radiofrequency signals, and avoids introducing intermodulation distortion due to metal-to-metal connections. The thickness of the ground plate, greater than the slot width, allows the ground plate to provide mechanical support. It is not obvious that an aperture through such a thick ground plate could be used to couple signals from one side to the other with low loss.

In an embodiment of the invention, the aperture is an air-filled cavity.

This allows a particularly low-loss connection to be established.

In an embodiment of the invention, the ground plate is composed of a non-conductive moulding having an electrically conductive coating.

This allows the ground plate to be light weight and to be moulded in a shape to include the aperture, which may be an economical manufacturing method. The non-conductive moulding may comprises a plastic material and the conductive surface may comprise copper.

In an embodiment of the invention, the ground plate is composed of metal, which may be cast aluminium. This provides a ground plate with good strength. The apertures may be economically produced by moulding.

In an embodiment of the invention, the thickness of the ground plate is greater than four times the width of the slot. This allows signals to be coupled with low loss through a particularly thick ground plate.

In an embodiment of the invention, the width of the slot is greater than 1 mm and the thickness of the ground plate is greater than 5 mm. Preferably, the width of the slot is in the range 1 to 3 mm and the thickness of the ground plate is in the range 5 to 15 mm. This provides a combination of low loss radio frequency coupling and economical manufacturing due to the avoidance of tight dimensional tolerances.

In an embodiment of the invention, the aperture comprises a termination cavity at each end of the slot. This improves coupling of radio frequency signals through the aperture, giving low loss. Preferably, the termination cavity is cylindrical.

In an embodiment of the invention, the slot has a length of less than a wavelength at an operating frequency of the radio frequency transmission arrangement. This improves coupling of radio frequency signals through the aperture, giving low loss.

In an embodiment of the invention, the slot has a length of less than 0.3 of a wavelength at an operating frequency of the radio frequency transmission arrangement. This gives a compact implementation of the radio frequency transmission arrangement with low loss.

In an embodiment of the invention, the first transmission line crosses the slot directly opposite the point where the second transmission line crosses the slot.

This allows the first transmission line to be arranged to be directly above the second transmission line.

In an embodiment of the invention, the first transmission line crosses the slot at a point offset along the slot from the point where the second transmission line crosses the slot.

This allows the first and second transmission lines to be offset horizontally. This may be convenient in some circuit layouts.

In an embodiment of the invention, the first transmission line is formed by a printed track on a polyester film, disposed with an air gap between the polyester film and the ground plate.

This gives a low loss implementation with good coupling.

In an embodiment of the invention, the first and second terminating stubs have a diameter of substantially 0.1 of a wavelength at an operating frequency of the radio frequency transmission structure.

This provides a low loss implementation.

In an embodiment of the invention, each said substantially cylindrical terminating cavity has a diameter of substantially 0.1 of a wavelength at an operating frequency of the radio frequency transmission structure.

This provides a low loss implementation.

In an embodiment of the invention, the ground plate has a protrusion from the second side, the protrusion being arranged to pass through an opening in a metal plate disposed in a substantially parallel relationship with the ground plate, and the aperture being arranged to pass through the protrusion, whereby to provide a radio frequency connection through the metal plate to the second transmission line.

This allows a metal plate to be used to reinforce the ground plate, without affecting the radio frequency performance of the coupling between the first and second transmission lines through the aperture, since the aperture need not be formed in two materials having a joining surface between them.

Further features and advantages of the invention will be apparent from the following description of preferred embodiments of the invention, which are given by way of example only.

DETAILED DESCRIPTION

By way of example, embodiments of the invention will now be described in the context of a radio frequency connection arrangement in which a radio frequency transmission path is provided from one side of a ground plate to the opposite side of a ground plate, the ground plate being a backing plate for an array of printed antenna elements. However, it will be understood that this is by way of example only and that other embodiments may involve transmission paths between transmission lines having various grounding arrangements, not necessarily in the context of antenna systems, where a radio frequency connection is desired between a transmission line on one side of a grounded structure and another transmission line on the other side of a grounded structure. In an embodiment of the invention, an operating frequency of approximately 5 GHz is used, but the embodiments of the invention are not restricted to this frequency, and lower operating frequencies of 1 GHz or less and higher operating frequencies of up to 60 GHz or higher frequencies may be used.

Figure 1:
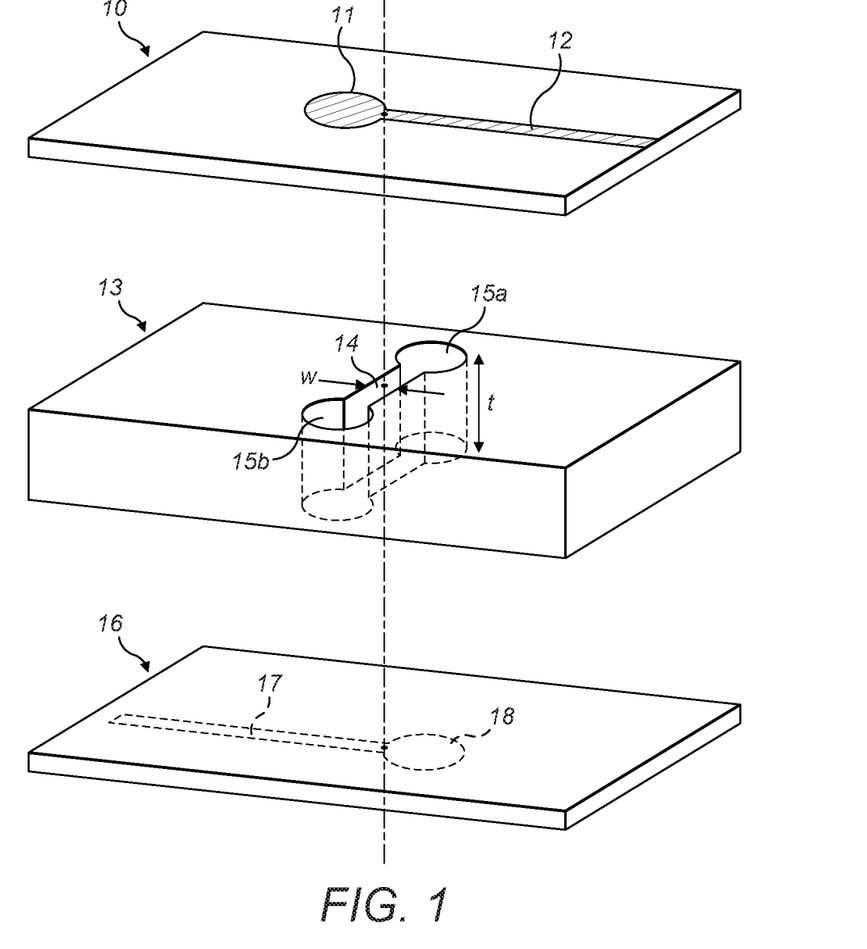
FIG. 1 is a schematic diagram showing an exploded view of a radio frequency transmission arrangement in an embodiment of the invention.
Figure 2:
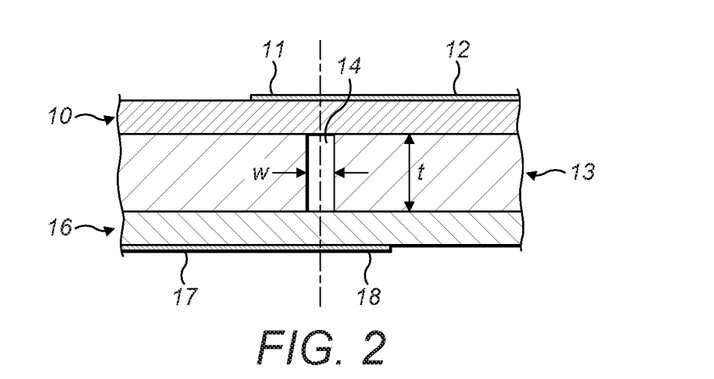
FIG. 2 is a schematic diagram showing a cross section of the radio frequency transmission arrangement of FIG. 1 in an embodiment of the invention.

FIG. 1 shows an exploded view of a radio frequency connection arrangement in an embodiment of the invention arranged to connect radio frequency signals from a first transmission line comprising signal conductor 12 through a ground plate 13, to a second transmission line on the other side of the ground plate comprising signal conductor 17. FIG. 2 shows a cross-section of the radio frequency arrangement of FIG. 1. As can be seen in FIGS. 1 and 2, the ground plate 13 is provided with an aperture 14, 15a, 15b passing through the ground plate from the one side of the ground plate 13 to the opposite side. The thickness of the ground plane t is greater than the width of the slot w, typically by a factor of 4 or more. A slot width of 2 mm has been found to give good coupling performance with a ground plane thickness of 10 mm, for example. Signals are coupled through the aperture from the first transmission line to the second transmission line, and vice versa. This allows signals to be coupled through the ground plate without an electrically conductive connection between the conductors of the first and second transmission lines. As a result, the use of co-axial connectors is avoided, saving cost, and mechanical construction tolerances are relaxed, in particular when more than one connection is provided through a ground plate. Furthermore, this provides a connection which causes low loss to radiofrequency signals, and avoids introducing intermodulation distortion due to metal-to-metal connections.

Figure 3:
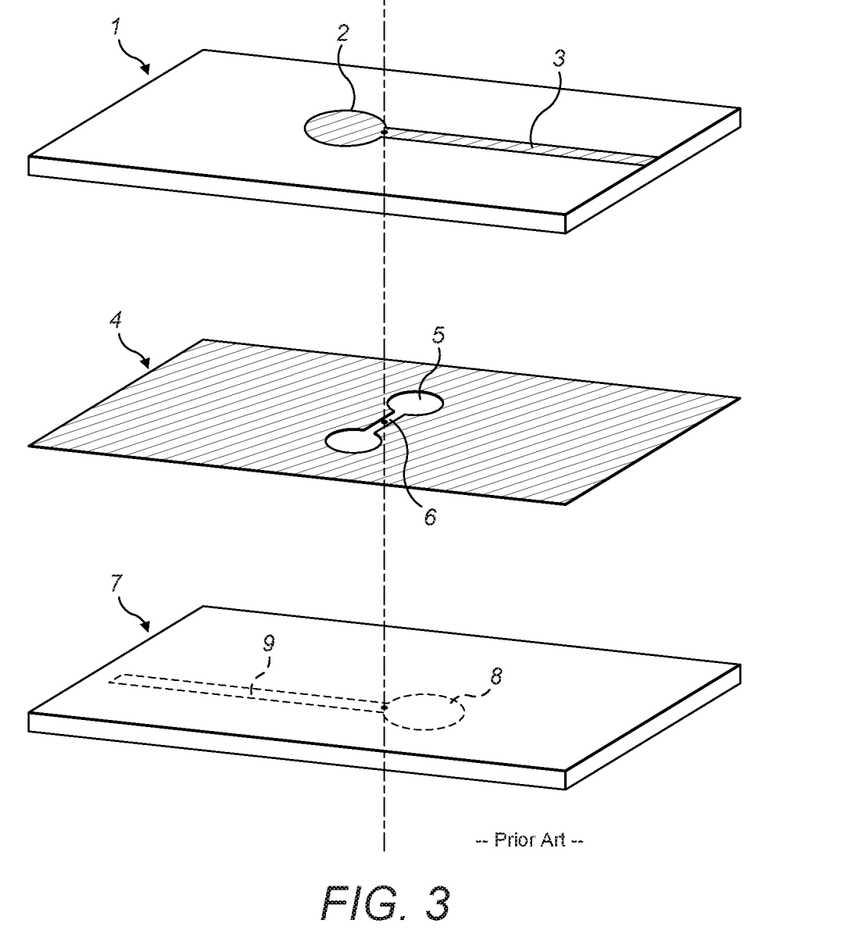
FIG. 3 is a schematic diagram showing an exploded view of a slot-coupled interconnect according to the prior art.
Figure 4:
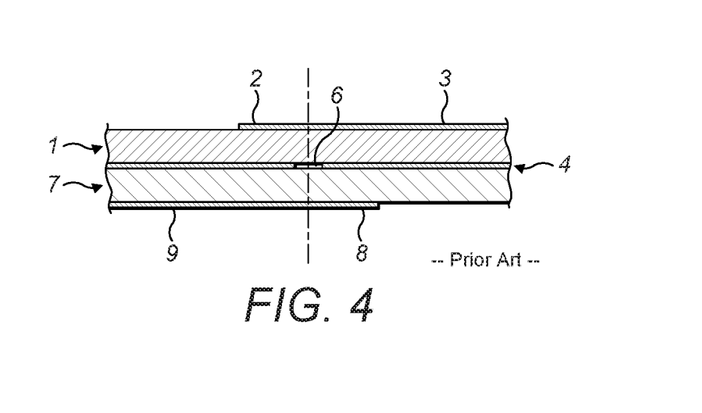
FIG. 4 is a schematic diagram showing a cross section of the slot-coupled interconnect of FIG. 3.

As shown in FIGS. 3 and 4, it is known to provide slot-coupled interconnect connections between signal tracks on different layers of a printed circuit board. A conventional via connection between layers of a printed circuit board is provided by a plated through hole, being a hole drilled through the board to intercept the tracks to be joined, and plated with copper to connect the intercepted tracks electrically. In a slot-coupled interconnect as disclosed in the publication "Slot-Coupled Double-Sided Microstrip Interconnects and Couplers" by Ho, Fan and Chang, 1993 IEEE MTT-S Digest, and as illustrated by FIGS. 3 and 4, radio frequency signals are coupled between layers of a multilayer printed circuit board, through an aperture in a ground plane forming a layer of the printed circuit board. As shown in exploded view in FIG. 3 and in cross-section in FIG. 4, a signal track 3 is printed on a dielectric substrate layer 1 of a printed circuit board and has a terminating stub 2. The layer in the printed circuit board below the substrate layer 1 is a ground plane 4, typically composed of a thin layer of copper. The copper layer has a dumbbell-shaped aperture comprising a slot 6 between terminating parts 5. Below the ground plane 4 is another dielectric substrate layer 7, on the lower side of which is printed another signal track 9 which has a terminating stub 8. Signals are coupled from one signal track through the aperture to the other signal track.

The ground plane of FIGS. 3 and 4, being a layer of a multilayer board, is thin, and much thinner than the width of the slot. It is not at all obvious that signals could be coupled with low loss through an aperture in a ground plate having significant thickness, let alone a ground plate that is thicker than the width of the slot. Radio frequency fields would be expected to be different in a deep, three-dimensional aperture as compared to the fields in an essentially 2 dimensional ground plane.

Returning to FIGS. 1 and 2, a ground plate 13 has first and second opposite sides and an aperture 14, 15a, 15b passing through the ground plate from the first side to the second side, the aperture comprising a slot 14. As can be seen, the slot 14 has an elongate cross-section in the plane of the first side of the ground plate, and the cross-section has substantially parallel sides extending along the length of the cross section. The slot has a width w which is the distance between the parallel sides of the cross-section of the slot as shown in FIG. 1.

Signal transmission in the connection arrangement is reciprocal, so the arrangement may be used to connect radio frequency signals from the first transmission line to the second transmission line or from the second transmission line to the first transmission line. The first transmission line comprises a signal track, or first elongate conductor, 12, which in the embodiment of FIGS. 1 and 2 is printed on a dielectric substrate 10, and the ground plate 13 provides a ground reference for the first transmission line. The ground plate may be a backing plate providing a ground reference and mechanical support for an array of patch antenna elements which are connected to the first transmission line by a feed network.

The second transmission line comprises a second signal track, or second elongate conductor 17 printed on a dielectric substrate 16 and the ground plate 13 similarly provides a ground reference for the second transmission line. The second transmission line may be connected to a radio transceiver circuit board, the radio transceiver being arranged to transmit and/or receive using the antenna array. The ground plate may have a substantially planar surface underlying the first transmission line, which may include apertures or hollows, for example resonant cavities for patch antennas, and may have a non-uniform cross-section, for example comprising fixing posts. The ground plate may, for example, be milled from an aluminium block, cast, or moulded. The term "ground" is used to mean a radio frequency reference, for example for an unbalanced transmission line, which does not necessarily require a direct current (DC) connection to an electrical ground or earth. The first and second transmission lines are unbalanced transmission lines referenced to the ground plate.

As may be seen, the first transmission line comprises a first elongate conductor 12 disposed on the first side of the ground plate in a substantially parallel relationship with the first side of the ground plate. In the embodiment of FIG. 1, a dielectric substrate 10, such as epoxy resin circuit board material, separates the first elongate conductor from the ground plate. In the embodiment shown, the spacing between the first elongate conductor and the ground plate is greater than the thickness of the ground plate.

The second transmission line comprises a second elongate conductor 17 disposed on the second side of the ground plate 13 in a substantially parallel relationship with the second side of the ground plate. As can be seen in FIG. 1, the second transmission line has the second elongate conductor 17 terminated with a termination stub 18. In the embodiment shown in FIG. 1, the terminating stub 18 of the second transmission line has a diameter of substantially 0.1 of a wavelength at an operating frequency of the radio frequency transmission structure, which has been found to provide a low loss implementation. The terminating stub 18 provides a match to the characteristic impedance of the transmission line, which may be typically 50 Ohms, in conjunction with the impedance presented by the aperture. The spacing between the second elongate conductor and the ground plate may be greater than the thickness of the ground plate.

In the embodiment of FIG. 1, the first transmission line has the first elongate conductor 12 also terminated with a termination stub 11, typically having the same dimensions as the terminating stub of the second transmission line.

It can be seen that the first transmission line is arranged to cross the slot, in the embodiment of FIG. 1 at a point adjacent to the termination stub 11, and the second transmission line is also arranged to cross the slot, at a point adjacent to the termination stub 18.

As shown in the embodiment of FIGS. 1 and 2, the aperture is an air-filled cavity. In alternative embodiments the aperture may be filled with a dielectric material. However, it has been found that an air-filled cavity gives low loss characteristics.

The ground plate may be composed of a non-conductive moulding, for example a moulding of a plastics material, having an electrically conductive coating, for example copper, allowing the ground plate to be light weight and to be moulded in a shape to include the aperture. This may provide an economical manufacturing method, and it has been found that apertures may be economically produced by moulding. In particular, it has been found that apertures having slots of width of 2 mm or greater are particularly suitable for production by moulding.

Alternatively, the ground plate is composed of metal, for example cast aluminium, which may provide good strength.

It has been found that the width of the slot is advantageously greater than 1 mm and the thickness of the ground plate is advantageously greater than 5 mm. Preferably, the width of the slot is in the range 1 to 3 mm and the thickness of the ground plate is in the range 5 to 15 mm. This provides a combination of low loss radio frequency coupling and economical manufacturing due to the avoidance of tight dimensional tolerances.

In the embodiment shown in FIGS. 1 and 2, the aperture comprises a termination cavity 15a, 15b at each end of the slot 14. The termination cavities may, for example, be cylindrical as shown. This improves coupling of radio frequency signals through the aperture, giving low loss and extended bandwidth. In an embodiment of the invention, the slot has a length of less than a wavelength at an operating frequency of the radio frequency transmission arrangement, which improves coupling of radio frequency signals through the aperture, giving low loss. It has been found that a slot having a length of less than 0.3 of a wavelength at an operating frequency of the radio frequency transmission arrangement gives a compact implementation of the radio frequency transmission arrangement with low loss. Typically a slot length of 0.2 wavelengths, the slot length excluding the diameter of the cylindrical terminating cavities 15a, 15b, has been found to give good performance, and each said substantially cylindrical terminating cavity having a diameter of substantially 0.1 of a wavelength at an operating frequency of the radio frequency transmission structure has also been found to give good performance, providing a low loss implementation.

In the embodiment shown in FIGS. 1 and 2, the first transmission line crosses the slot directly opposite the point where the second transmission line crosses the slot, allowing the first transmission line to be arranged to be directly above the second transmission line.

Figure 5:
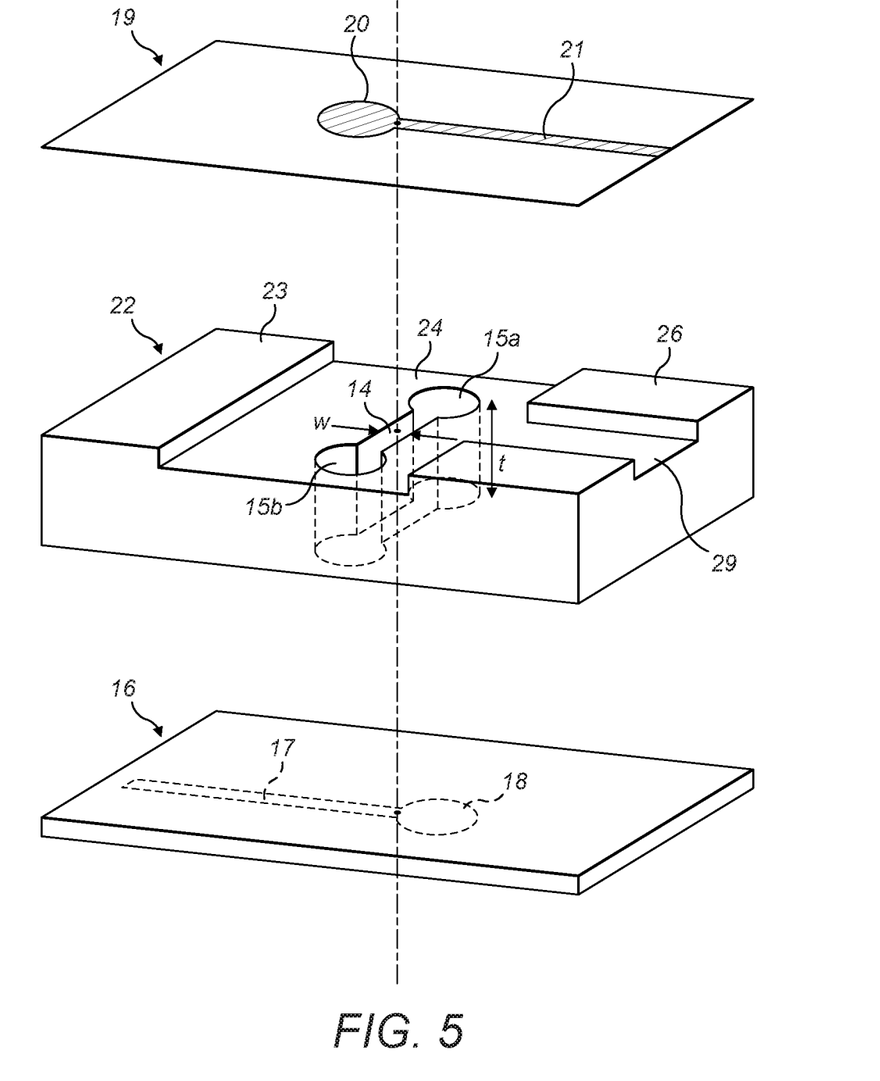
FIG. 5 is a schematic diagram showing an exploded view of a radio frequency transmission arrangement in which the first transmission line is printed on a thin dielectric film in an embodiment of the invention.

FIG. 5 shows an embodiment of the invention in which the first transmission line is formed by a printed track 21 on a polyester film 19, disposed with an air gap between the polyester film and the ground plate. The polyester film may be very thin, typically 0.05 mm or less thick. This reduces dielectric loss effects as the electric fields between the conductor and the ground plate are mainly in air. This gives a low loss implementation with good coupling. As shown in FIG. 5, raised sections of the ground plate 23, 26 may be provided to support the polyester film, or film made of another dielectric material, maintaining the air gap. The second transmission line may be formed with a dielectric film and air gap in a similar manner to the first transmission line. Optionally, grounded conductive covers may be provided over the first transmission line 21 and/or the second transmission line 17, arranged to cover the termination stubs 18, 20 also. The second transmission line, in the embodiment shown, comprises a printed microstrip track 17 on a dielectric substrate 16. The covers are sufficiently separated from the transmission lines to avoid changes in the microstrip behaviour but help avoid radiation loss. For example, the separation of the cover from the transmission line may be greater than the separation of the transmission line from the ground plate 22. The ground plate 22 may have recessed regions 24, 29.

Figure 6:
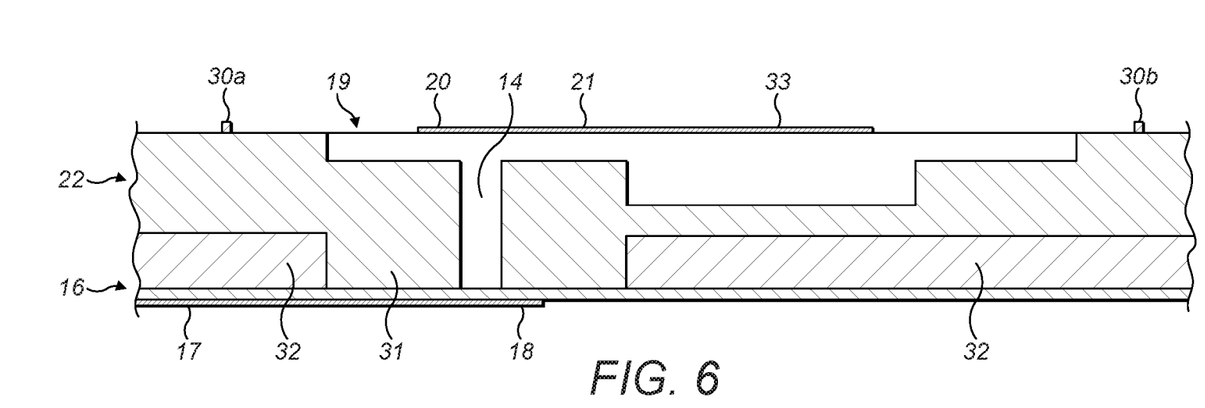
FIG. 6 is a schematic diagram showing a cross-section of a radio frequency transmission arrangement in which the first transmission line is printed on a thin dielectric film an in which the ground plate has a projection projecting through an opening in a metal plate in an embodiment of the invention.

FIG. 6 shows a cross section of an embodiment of the invention, in which the ground plate 22 has a protrusion 31 from the second side, the protrusion being arranged to pass through an opening in a metal plate 32 disposed in a substantially parallel relationship with the ground plate. The aperture 14 is arranged to pass through the protrusion, so that a radio frequency connection is provided through the metal plate 32 to the second transmission line 17.

The metal plate 32 may be used to reinforce the ground plate, and to provide heat sinking. The ground plate may be plated plastic, which may have poor thermal conductivity. The protrusion of the ground plate surrounding the aperture through a hole in the metal plate avoids the aperture passing through a join between the metal plate and the ground plate, which may otherwise affect the radio frequency performance of the coupling between the first and second transmission lines through the aperture due to the discontinuity of the ground plane.

As also shown in FIG. 6, the signal conductor of the first transmission line 21 may be connected to an antenna patch radiator element, shown in section with reference numeral 33. The ground plate may have a recess provided under the antenna patch radiator element, to improve radiating and reception performance of the patch. It is advantageous to have a thick ground plane, thicker than the width of the slot of the aperture, in order to accommodate the recesses and the metal reinforcing plate between the planes of the first and second transmission lines. The second transmission line may be part of a printed circuit board, for example the conductive tracks could be printed on a layer of a multilayer printed circuit board, for example as part of a radio transceiver. As shown in FIG. 6, the dielectric film 19 may be located over protrusions, also referred to as pips, 30a, 30b. This may facilitate keeping the film 19, which is typically flexible, planar and with a controlled spacing from ground plate 22.

Figure 7:
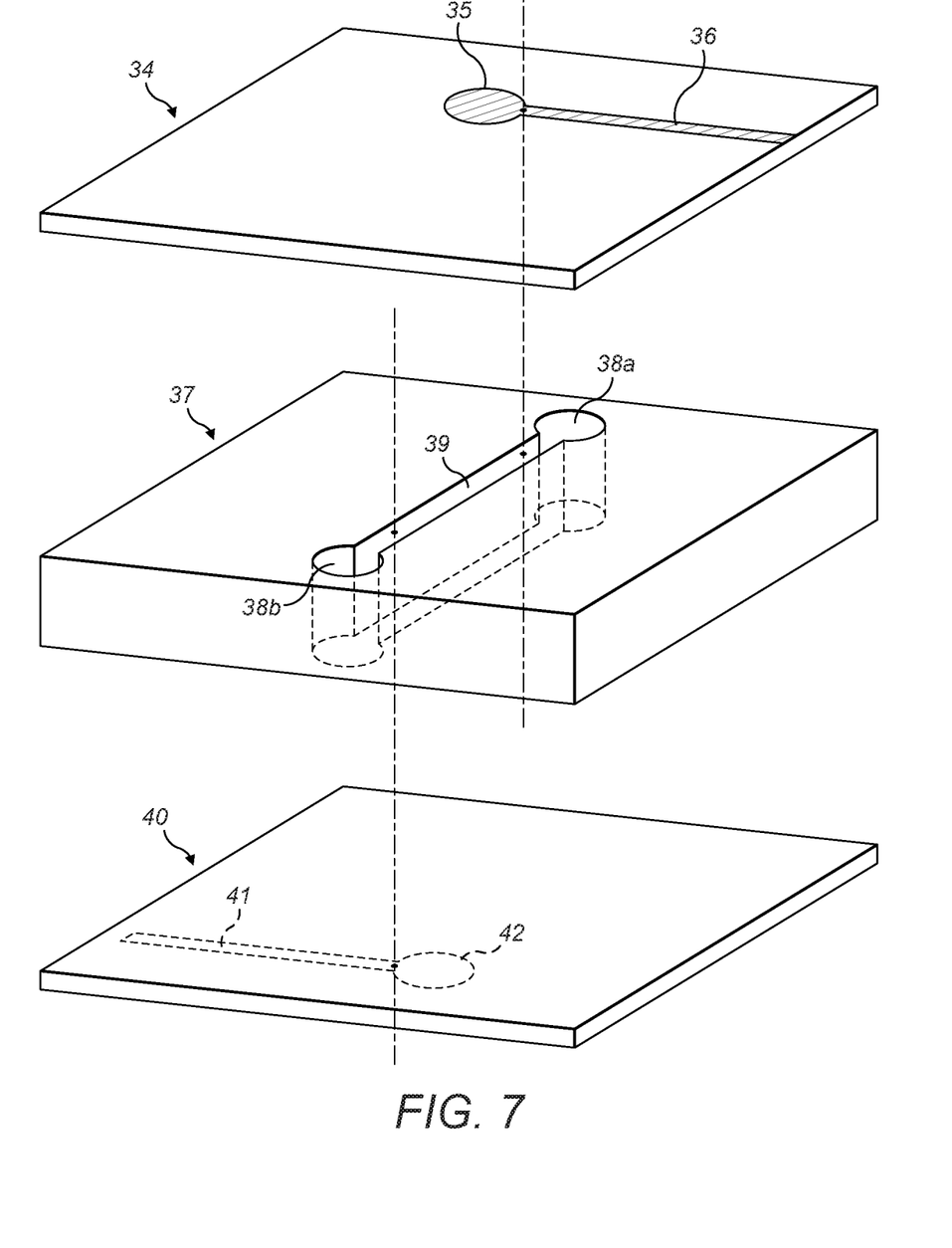
FIG. 7 is a schematic diagram showing an exploded view of a radio frequency transmission arrangement in which the first transmission line is offset laterally from the second transmission line.

FIG. 7 shows an embodiment of the invention in which the first transmission line 36 crosses the slot 39 at a point offset along the slot from the point where the second transmission line 41 crosses the slot. This allows the first and second transmission lines to be offset horizontally. This may be convenient in some circuit layouts. In the embodiment shown, the first transmission line 36 has a termination stub 35 and is formed as a printed track on a dielectric substrate 34. In alternative embodiments the dielectric substrate could be a film. The ground plate 37 has an aperture 39, 38a, 38b. The second transmission line comprises a printed track 41 with a termination stub 42 printed on a dielectric substrate 40.

The skilled person would understand that other shapes than those shown could be used for the termination stubs. Typically a shape would be modelled on a computer simulation package and adjusted to give a good impedance match resulting in a low return loss.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A radio frequency transmission arrangement configured to provide a transmission path from a first transmission line on a first side of a ground plate to a second transmission line on a second side of the ground plate, opposite to the first side,
    wherein the ground plate has an aperture passing through the ground plate from the first side to the second side, the aperture comprising a slot, the slot having an elongated cross-section in a plane of the first side of the ground plate, the cross-section having substantially parallel sides extending along a length of the cross section, and the slot having a width which is a distance between the parallel sides of the cross-section of the slot, a thickness of the ground plate being greater than the width of the slot,
    wherein the first and second transmission lines are unbalanced transmission lines referenced to the ground plate and arranged to cross the slot, and
    wherein the thickness of the ground plate is greater than four times the width of the slot.

2. The radio frequency transmission arrangement of claim 1, wherein the aperture is an air-filled cavity.

3. The radio frequency transmission arrangement of claim 1, wherein the ground plate is composed of a non-conductive moulding having an electrically conductive coating.

4. The radio frequency transmission arrangement of claim 3, wherein the non-conductive moulding comprises a plastic material and the conductive coating comprises copper.

5. The radio frequency transmission arrangement of claim 1, wherein the ground plate is composed of metal.

6. The radio frequency transmission arrangement of claim 5, wherein the metal is composed of cast aluminium.

7. The radio frequency transmission arrangement of claim 1, wherein the width of the slot is greater than 1 mm and the thickness of the ground plate is greater than 5 mm.

8. The radio frequency transmission arrangement of claim 1, wherein the width of the slot is in a range of 1 to 3 mm and the thickness of the ground plate is in a range of 5 to 15 mm.

9. The radio frequency transmission arrangement of claim 1, wherein the aperture comprises a termination cavity at each end of the slot.

10. The radio frequency transmission arrangement of claim 9, wherein each termination cavity is cylindrical.

11. The radio frequency transmission arrangement of claim 10, wherein each cylindrical terminating cavity has a diameter of substantially 0.1 of a wavelength at an operating frequency of the radio frequency transmission arrangement.

12. The radio frequency transmission arrangement of claim 1, wherein the length of the slot is less than a wavelength at an operating frequency of the radio frequency transmission arrangement.

13. The radio frequency transmission arrangement of claim 12, wherein the length of the slot is less than 0.3 of a wavelength at the operating frequency of the radio frequency transmission arrangement.

14. The radio frequency transmission arrangement of claim 1, wherein the first transmission line is formed by a printed track on a dielectric film, disposed with an air gap between the dielectric film and the ground plate.

15. The radio frequency transmission arrangement of claim 14, wherein the dielectric film is a polyester film.

* * * * *